(12) United States Patent
Kato et al.

(10) Patent No.: US 9,159,940 B2
(45) Date of Patent: Oct. 13, 2015

(54) CONDUCTIVE ADHESIVE COMPOSITION, ELECTRONIC DEVICE, POSITIVE ELECTRODE LAMINATE, AND METHOD FOR MANUFACTURING ELECTRONIC DEVICE

(75) Inventors: Kunihisa Kato, Tokyo (JP); Tsuyoshi Muto, Tokyo (JP); Emi Nakajima, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 88 days.

(21) Appl. No.: 13/876,639

(22) PCT Filed: Jul. 20, 2011

(86) PCT No.: PCT/JP2011/066493
§ 371 (c)(1),
(2), (4) Date: May 16, 2013

(87) PCT Pub. No.: WO2012/043025
PCT Pub. Date: Apr. 5, 2012

(65) Prior Publication Data
US 2013/0306943 A1    Nov. 21, 2013

(30) Foreign Application Priority Data
Sep. 30, 2010  (JP) ................. 2010-220319

(51) Int. Cl.
*C08F 2/44* (2006.01)
*H01L 29/08* (2006.01)
(Continued)

(52) U.S. Cl.
CPC ............ *H01L 51/441* (2013.01); *C09D 165/00* (2013.01); *C09J 9/02* (2013.01);
(Continued)

(58) Field of Classification Search
CPC .......... C09J 139/06; C09J 9/02; C09J 129/04; C09J 179/02; C09J 11/06; C09J 125/18; C09J 133/04; C09J 11/08; C09J 125/02; H01B 1/127; H01B 1/128; H01L 51/0024; H01L 51/441; H01L 51/5056; H01L 51/5203; C09D 165/00; C08K 5/54; C08K 5/41; C08K 5/20; C08K 5/3415; C08K 5/053; C08G 2261/3221; C08G 2261/3223; C08L 2205/03
USPC ......... 257/40; 428/344; 438/82, 46; 252/500; 524/849

See application file for complete search history.

(56) References Cited

U.S. PATENT DOCUMENTS

| 4,860,754 A | 8/1989 | Sharik et al. |
| 2005/0154119 A1* | 7/2005 | Robeson et al. ............... 524/502 |

(Continued)

FOREIGN PATENT DOCUMENTS

| CN | 1527854 A | 9/2004 |
| CN | 101210158 A | 7/2008 |

(Continued)

OTHER PUBLICATIONS

MSDS, ACROS Organics, Created Jul. 1, 1999, Revision #5 date Jul. 20, 2009.*

(Continued)

*Primary Examiner* — William Cheung
(74) *Attorney, Agent, or Firm* — Oblon, McClelland, Maier & Neustadt, L.L.P.

(57) ABSTRACT

An electronic device having, arranged in the following order, a cathodic layer, a conductive layer, a photoelectric conversion layer, and an anodic layer. The conductive layer contains a conductive adhesive composition which contains:
(A) a water-soluble polyvinyl polymer,
(B) an organic additive, and
(C) a conductive organic polymer compound.

8 Claims, 2 Drawing Sheets

(51) Int. Cl.
| | |
|---|---|
| *B32B 7/12* | (2006.01) |
| *H01L 21/00* | (2006.01) |
| *H01B 1/00* | (2006.01) |
| *H01L 51/44* | (2006.01) |
| *C09J 139/06* | (2006.01) |
| *C09J 179/02* | (2006.01) |
| *H01B 1/12* | (2006.01) |
| *H01L 51/00* | (2006.01) |
| *H01L 51/50* | (2006.01) |
| *C09J 165/00* | (2006.01) |
| *C09J 9/02* | (2006.01) |
| *C09J 11/06* | (2006.01) |
| *C09J 11/08* | (2006.01) |
| *H01L 51/52* | (2006.01) |
| *C09J 133/04* | (2006.01) |
| *C09D 165/00* | (2006.01) |
| *C09J 125/18* | (2006.01) |
| *C09J 129/04* | (2006.01) |
| *C08K 5/053* | (2006.01) |
| *C08K 5/3415* | (2006.01) |

(52) U.S. Cl.
CPC ............... *C09J 11/06* (2013.01); *C09J 11/08* (2013.01); *C09J 125/18* (2013.01); *C09J 129/04* (2013.01); *C09J 133/04* (2013.01); *C09J 139/06* (2013.01); *C09J 165/00* (2013.01); *C09J 179/02* (2013.01); *H01B 1/127* (2013.01); *H01B 1/128* (2013.01); *H01L 51/0024* (2013.01); *H01L 51/5056* (2013.01); *H01L 51/5203* (2013.01); *C08G 2261/3221* (2013.01); *C08G 2261/3223* (2013.01); *C08K 5/053* (2013.01); *C08K 5/3415* (2013.01); *C08L 2203/204* (2013.01); *Y10T 428/2804* (2015.01)

(56) References Cited

U.S. PATENT DOCUMENTS

2009/0286097 A1    11/2009  Yang et al.
2013/0306943 A1*   11/2013  Kato et al. ............... 257/40

FOREIGN PATENT DOCUMENTS

| JP | 7 118524 | 5/1995 |
|---|---|---|
| JP | 8 253755 | 10/1996 |
| JP | 2006 147900 | 6/2006 |
| JP | 2006 352073 | 12/2006 |
| JP | 2007 305351 | 11/2007 |
| JP | 2008 62443 | 3/2008 |
| JP | 2008 168607 | 7/2008 |
| JP | 2008 288102 | 11/2008 |
| JP | 2009 1801 | 1/2009 |
| JP | 2009 500832 | 1/2009 |
| TW | 200943321 A1 | 10/2009 |
| WO | WO 02/079316 A2 | 10/2002 |
| WO | WO 02/079316 A3 | 10/2002 |
| WO | WO 2007/005617 A2 | 1/2007 |
| WO | WO 2011/079157 A2 | 6/2011 |
| WO | WO 2011/079157 A3 | 6/2011 |

OTHER PUBLICATIONS

Combined Office Action and Search Report issued Jun. 24, 2014 in Chinese Patent Application No. 201180046344.0 (with English translation of category of cited documents).

Combined Taiwanese Office Action and Search Report issued Sep. 24, 2014 in Patent Application No. 100134494 (with English translation of categories of cited documents).

International Search Report Issued Sep. 20, 2011 in PCT/JP11/66493 Filed Jul. 20, 2011.

Extended European Search Report issued May 19, 2014 in Patent Application No. 11828586.5.

* cited by examiner (a)

(b)

CONDUCTIVE ADHESIVE COMPOSITION, ELECTRONIC DEVICE, POSITIVE ELECTRODE LAMINATE, AND METHOD FOR MANUFACTURING ELECTRONIC DEVICE

This application is a 371 of PCT/JP11/66493 filed Jul. 20, 2011. Priority to Japanese patent application 2010-220319, filed Sep. 30, 2010, is claimed.

TECHNICAL FIELD

The present invention relates to a conductive adhesive composition, an electronic device, a anodic laminate, and a method for manufacturing an electronic device.

BACKGROUND ART

In recent years, in organic electroluminescences, various solar cells, touch panels, mobile phones, electronic papers, and the like, transparent electrodes using a transparent conductive film are being eagerly investigated.

For example, organic photoelectric conversion or electric-optical conversion devices represented by organic thin-film solar cells are usually fabricated by laminating materials on electrodes composed of a transparent conductive film. As for the transparent conductive film, though various conductive films such as metal thin films, metal oxide thin films, conductive nitride thin films are being investigated, metal oxide thin films are the mainstream at present because they are chiefly capable of making both light transmission properties and conductivity compatible with each other and are also excellent in terms of durability. Above all, in particular, tin-doped indium oxide (ITO) is widely used in view of the facts that it is well balanced between light transmission properties and conductivity and that it is easy for achieving the formation of a fine electrode pattern by means of wet etching with an acid solution (Patent Document 1).

On the other hand, there is proposed a sheet in which a metal-made fine mesh or grid is formed on a transparent base material such as PET (Patent Document 2). There is a possibility of utilization of such a sheet as a transparent electrode because its translucency and conductivity can be controlled according to a design of the mesh (rate of opening determined by a pitch or line width).

Now, in the case of laminating layers composed of an organic element material, electronic devices have hitherto been manufactured by a vacuum vapor deposition method or a dry process analogous thereto, a wet process represented by coating, or a lamination process via a pressure-sensitive adhesive layer (Patent Document 3). In such a lamination process, transparent electrode films and transparent conductive films having stickiness have been desired; however, the conventional transparent conductive films involve a problem on a balance among transparency, stickiness, and low resistivity.

Accordingly, it has been proposed to use, as a conductive component in a conductive adhesive composition, a conductive organic polymer compound such as polythiophene or derivatives thereof. More specifically, it has been proposed to manufacture an electronic device by a lamination process via a pressure-sensitive adhesive layer containing a conductive organic polymer compound (see Patent Document 4 and the like).

However, in the lamination process via a pressure-sensitive adhesive layer containing a conductive organic polymer compound, the utilization was limited in an element application in which cleanliness and uniformity of an interface are important. In addition, there was involved such a problem that the performance of an electronic device is lowered, for example, the conductivity of the pressure-sensitive adhesive layer is low, the carrier injection efficiency at the laminate interface is lowered, an adhesive force of an interface is low, and the like.

PRIOR ART DOCUMENTS

Patent Documents

[Patent Document 1] JP-A-2007-305351
[Patent Document 2] JP-A-2008-288102
[Patent Document 3] JP-A-2006-352073
[Patent Document 4] JP-T-2009-500832

DISCLOSURE OF THE INVENTION

Problem to be Solved by the Invention

Under such circumstances, the present invention has been made. An object of the present invention is to provide a conductive adhesive composition, an electronic device having a conductive layer composed of a conductive adhesive composition, a anodic laminate composed of the same conductive layer, and a method for manufacturing an electronic device, each of which is capable of solving the foregoing problem.

Means for Solving the Problem

In order to solve the foregoing problem, the present inventors made extensive and intensive investigations. As a result, it has been found that the foregoing problem can be solved by adding a specified organic additive to a water-soluble polyvinyl polymer together with a conductive organic polymer compound, leading to accomplishment of the present invention.

Specifically, the present invention provides:

(1) A conductive adhesive composition comprising (A) a water-soluble polyvinyl polymer, (B) an organic additive, and (C) a conductive organic polymer compound, wherein the organic additive (B) is at least one member selected from water-soluble polyhydric alcohols, water-soluble pyrrolidones, and hydrophilic aprotic solvents, and the conductive organic polymer compound (C) is at least one member selected from polyanilines, polypyrroles, polythiophenes, and derivatives thereof;

(2) The conductive adhesive composition as set forth above in (1), wherein when a glass transition temperature of the water-soluble polyvinyl polymer is defined as T1, a melting point of the organic additive (B) is defined as T2, and a boiling point of the organic additive at 0.101 MPa (760 mmHg) is defined as T3, a relationship of T2<T1<T3 is satisfied;

(3) The conductive adhesive composition as set forth above in (1), wherein the water-soluble polyvinyl polymer is at least one member selected from a polyvinyl alcohol, a polyvinylpyrrolidone, and a polyacrylic acid;

(4) An electronic device comprising a conductive layer composed of the conductive adhesive composition as set forth above in (1);

(5) The electronic device as set forth above in (4), comprising a anodic layer, a conductive layer composed of the conductive adhesive composition as set forth above in (1), a photoelectric conversion layer, and an cathodic layer arranged in this order;

(6) The electronic device as set forth above in (4), comprising a anodic layer, a conductive layer composed of the conductive adhesive composition as set forth above in (1), a light-emitting layer, and an cathodic layer arranged in this order;

(7) A anodic laminate comprising a base material having a anodic layer and a conductive layer composed of the conductive adhesive composition as set forth above in (1) laminated thereon in this order; and (8) A method for manufacturing the electronic device as set forth above in (4), comprising a step of forming a conductive layer composed of the conductive adhesive composition as set forth above in (1) on a anodic layer to form a anodic laminate, a step of forming a photoelectric conversion layer or a light-emitting layer on an cathodic layer to form an cathodic laminate, and sticking a surface of the photoelectric conversion layer or light-emitting layer in the cathodic laminate and a surface of the conductive layer in the anodic laminate to each other at a temperature at which the conductive adhesive composition is softened or higher.

Effects by the Invention

As for the conductive adhesive composition according to the present invention, by adding a specified (co)polymer and a specified organic additive to a conductive organic polymer compound, a layer composed of this conductive adhesive composition is low in terms of surface resistance and high in terms of transparency, and it can be used as a conductive layer of an electronic device.

In addition, a conductive layer composed of the conductive adhesive composition according to the present invention itself has excellent adhesiveness, and therefore, it is able to manufacture an electronic device by a lamination process.

BRIEF DESCRIPTION OF THE DRAWINGS

FIG. 1(b) is a schematic view showing a method for manufacturing an electronic device according to the present invention.

BEST MODES FOR CARRYING OUT THE INVENTION

Figure 1:
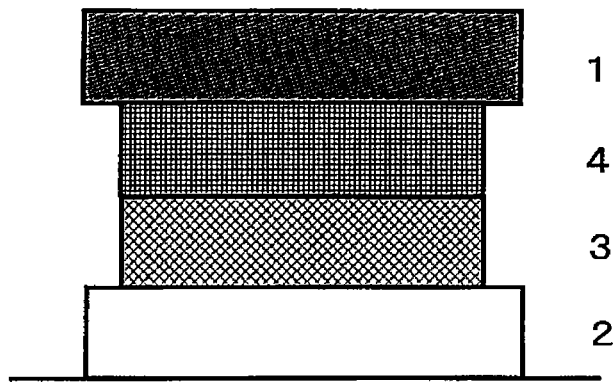
FIG. 1 (a) is a schematic view showing a cross section of an example of an electronic device having a conductive layer according to the present invention.
Figure 1:
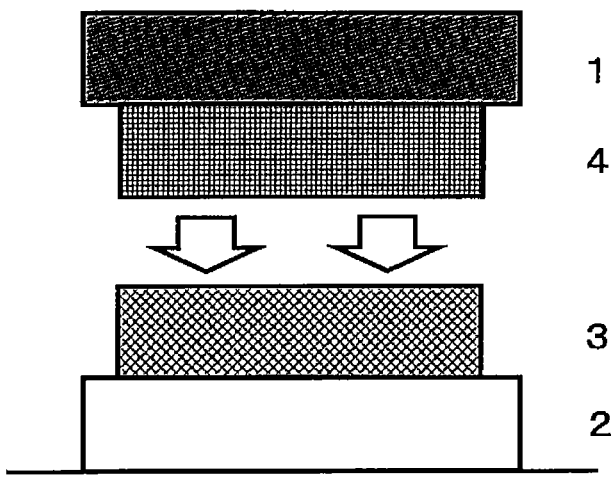

The conductive adhesive composition, the electronic device, the anodic laminate, and the method for manufacturing an electronic device according to the present invention are hereunder described in detail.

[1] Conductive Adhesive Composition

First of all, each of components in the conductive adhesive composition is described.

Water-Soluble Polyvinyl Polymer

The water-soluble polyvinyl polymer as the component (A) is a compound for imparting sufficient adhesiveness to a conductive layer composed of the conductive adhesive composition without lowering conductivity of the conductive layer. The water-soluble polyvinyl polymer also includes a warm water-soluble polyvinyl polymer.

In view of film formation properties, adhesiveness, and handling, a glass transition temperature (Tg) of the water-soluble polyvinyl polymer is preferably in the range of from −50 to 150° C., more preferably in the range of from 20 to 140° C., still more preferably in the range of from 30 to 130° C., and yet still more preferably in the range of from 40 to 120° C.

The water-soluble polyvinyl polymer is a compound having a structural unit of —$CH_2$—$CH(R)$— in the polymer. There are no particular limitations so far as at least 30% by mole or more of this structural unit is contained in the polymer. The water-soluble polyvinyl polymer may be a homopolymer or a copolymer each containing this structural unit. Of these, compounds in which R is any one of a hydroxyl group, a carboxyl group, a pyrrolidone group, or an acrylamide group are preferable.

A compound having a carboxyl group in the polymer is one having a structural unit of —$CH_2$—$CH(COOH)$—. Specific examples of the carboxyl group-containing water-soluble polyvinyl polymer include polyacrylic acid (PAA) and the like.

A compound having a hydroxyl group in the polymer is one having a structural unit of —$CH_2$—$CH(OH)$—.

Specific examples of the hydroxyl group-containing water-soluble polyvinyl polymer include polyvinyl alcohol (PVA), a polyvinyl alcohol-ethylene copolymer, a polyvinyl alcohol-(N-vinylformaldehyde) copolymer, a polyvinyl alcohol-vinyl acetate copolymer, and the like.

The hydroxyl group-containing water-soluble polyvinyl polymer may be a partially saponified product or a completely saponified product.

A degree of saponification is preferably from 20 to 100% by mole, more preferably from 35 to 100% by mole, and still more preferably from 40 to 100% by mole. In the case where the degree of saponification is less than 20% by mole, the solubility is lowered.

The pyrrolidone group-containing water-soluble polyvinyl polymer is one having a structural unit of —$CH_2$—$CH(NC_4O)$— and specific examples thereof include polyvinylpyrrolidone (PVP), an N-vinyl-2-pyrrolidone-ethylene copolymer, an N-vinyl-2-pyrrolidone-vinyl acetate copolymer, and the like.

The acrylamide group-containing water-soluble polyvinyl polymer is one having a structural unit of —$CH_2$—$CH(CONH_2)$— and specific examples thereof include polyacrylamide and the like.

For the purpose of imparting various functions, the water-soluble polyvinyl polymer may contain, in addition to the foregoing structural unit, a functional group such as a hydrophobic group, a cationic group, an anionic group including a sulfonic acid group, a thiol group, a carbonyl group, a silanol group, etc.

Among these water-soluble polyvinyl polymers, in view of the fact that the manufacture of an electronic device as described later can be easily achieved, those in which R is any one of a hydroxyl group, a carboxyl group, or a pyrrolidone group are preferable, and PVA, PVP, and PAA are preferable. Of these, in view of conductivity and adhesiveness of the obtained conductive layer, PAA in which R is a carboxyl group is more preferable.

A weight average molecular weight (Mw) of the water-soluble polyvinyl polymer is usually from 500 to 500,000, preferably from 500 to 300,000, more preferably from 1,000 to 200,000, and still more preferably from 3,000 to 150,000.

When Mw of the water-soluble polyvinyl polymer falls within this range, in the electronic device and the anodic laminate according to the present invention, sufficient film formation properties and adhesiveness are revealed.

It is to be noted that the foregoing Mw is a numerical value as reduced into standard polystyrene, which is measured by means of gel permeation chromatography (GPC).

So far as the foregoing water-soluble polyvinyl polymer is a polymer containing 30% by mole or more of the foregoing structural unit, it may also be copolymerized with one or two or more kinds of other copolymerizable ethylenically unsaturated monomers.

Examples of the other copolymerizable ethylenically unsaturated monomer include vinyl carboxylate monomers such as vinyl formate, vinyl acetate, vinyl propionate, isopropenyl acetate, vinyl valerate, vinyl caprate, vinyl caprate, vinyl laurate, vinyl stearate, vinyl benzoate, vinyl versatate, and vinyl pivalate, etc.; olefins such as ethylene, propylene, butylene, etc.; aromatic vinyl monomers such as styrene, and α-methylstyrene, etc.; ethylenically unsaturated carboxylic acid monomers such as methacrylic acid, fumaric acid, maleic acid, itaconic acid, monoethyl fumarate, maleic anhydride, and itaconic anhydride, etc.; ethylenically unsaturated carboxylic acid alkyl ester monomers such as methyl(meth)acrylate, ethyl(meth)acrylate, n-butyl(meth)acrylate, 2-ethylhexyl(meth)acrylate, dimethylfumarate, dimethylmaleate, diethylmaleate, and diisopropylitaconate, etc.; vinyl ether monomers such as methyl vinyl ether, n-propyl vinyl ether, isobutyl vinyl ether, and dodecyl vinyl ether, etc.; ethylenically unsaturated nitrile monomers such as (meth)acrylonitrile, etc.; halogenated vinyl monomers or vinylidene monomers such as vinyl chloride, vinylidene chloride, vinyl fluoride, and vinylidene fluoride, etc.; allyl compounds such as allyl acetate, and allyl chloride, etc.; sulfonic acid group-containing monomers such as ethylene sulfonic acid, (meth)allyl sulfonic acid, 2-acrylamide-2-methylpropane sulfonic acid, etc.; quaternary ammonium group-containing monomers such as 3-(meth)acrylamidepropyl trimethylammonium chloride, etc.; vinyltrimethoxysilane, N-vinylformamide, and methacrylamide, and the like. One or two or more kinds of these monomers can be used.

Hereinafter, the organic additive as the component (B) is described.

The present invention is characterized in that the organic additive as the component (B) is at least one member selected from water-soluble polyhydric alcohols, water-soluble pyrrolidones, and hydrophilic aprotic solvents.

For the purpose of enhancing the conductivity, the organic additive is added. While details are not elucidated yet, the conductivity is enhanced because by adding such an organic additive, the orientation properties of a conductive organic polymer compound as the component (C) as described later are enhanced.

The organic additive as the component (B) is preferably one having a boiling point of 100° C. or higher at 1.101 MPa (760 mmHg). What the boiling point is lower than 100° C. is not preferable because in a mixing process or during storage of the conductive adhesive composition, or various heating processes at the time of manufacturing an electronic device as described later, the organic additive causes volatilization and scattering, and its formulating ratio is lowered, so that the effect for enhancing the conductivity is lowered.

The boiling point is more preferably in the range of from 120 to 300° C., and still more preferably in the range of from 140 to 300° C.

Examples of the water-soluble polyhydric alcohol as one of the organic additives as the component (B) include glycerin, diglycerin, polyglycerin, ethylene glycol, diethylene glycol, propylene glycol, dipropylene glycol, 1,3-butanediol, and 1,4-butanediol, erythritol, sorbitol, sorbitan, glucose, maltitol, polyethylene glycol, 1,2-butylene glycol, 1,3-butylene glycol, 2,3-butylene glycol, 3-methyl-1,3-butylene glycol, tetramethylene glycol, 1,2-pentanediol, 1,2-hexanediol, trimethylolpropane, pentaerythritol, methyl glycoside, polypropylene glycol, xylitol, trehalose, maltitol, mannitol, and alkylene oxide derivatives thereof, and the like. One or two or more kinds of these water-soluble polyhydric alcohols may be used.

Examples of the water-soluble pyrrolidone as one of the organic additives as the component (B) include N-methylpyrrolidone, N-ethylpyrrolidone, N-propylpyrrolidone, N-isopropylpyrrolidone, N-butylpyrrolidone, N-t-butylpyrrolidone, N-pentylpyrrolidone, N-hexylpyrrolidone, N-heptylpyrrolidone, N-cyclohexylpyrrolidone, N-octylpyrrolidone, N-(2-ethylhexyl)pyrrolidone, N-phenylpyrrolidone, N-benzylpyrrolidone, phenethylpyrroplidone, 2-methoxyethylpyrrolidone, 2-methoxypropylpyrrolidone, 2-hydroxypropylpyrrolidone, vinylpyrrolidone, and 2-pyrrolidone, and the like. One or two or more kinds of these water-soluble pyrrolidones may be used.

In the present invention, an aprotic solvent is added as one of the organic additives as the component (B). In the present invention, the aprotic solvent is one to be formulated in the conductive adhesive composition without causing volatilization and scattering. Examples of such a hydrophilic aprotic solvent as one of the organic additives as the component (B) include dimethyl sulfoxide and N,N-dimethylformamide.

In the present invention, it is preferable to select the component (B) through a combination with the component (A) so as to satisfy the following relationship.

That is, when a glass transition temperature (Tg) of the water-soluble polyvinyl polymer as the component (A) is defined as T1, a melting point of the organic additive as the component (B) is defined as T2, and a boiling point of the organic additive at 0.101 MPa (760 mmHg) is defined as T3, the combination is a combination satisfying a relationship of T2<T1<T3.

Herein, the glass transition temperature T1 of the water-soluble polyvinyl polymer as the component (A) is a value measured with a differential scanning calorimeter (DSC).

Specific examples of the water-soluble polyhydric alcohol as the component (B) which satisfies the foregoing relationship relative to the component (A) include glycerin [melting point T2: 18° C., boiling point T3: 290° C.], ethylene glycol [melting point T2: −11.5° C., boiling point T3: 197° C.], diethylene glycol [melting point T2: −6.5° C., boiling point T3: 245° C.], propylene glycol [melting point T2: −59° C., boiling point T3: 188.2° C.], dipropylene glycol [melting point T2: −40° C., boiling point T3: 232° C.], 1,3-butanediol [melting point T2: −50° C., boiling point T3: 207.5° C.], 1,4-butanediol [melting point T2: 19° C., boiling point T3: 235° C.], and the like. Above all, from the viewpoint of enhancements in conductivity and stickiness, glycerin and 1,4-butanediol are preferable.

Examples of such a water-soluble pyrrolidone derivative as the component (B) include N-methylpyrrolidone [melting point T2: −24° C., boiling point T3: 202° C.], vinylpyrrolidone [melting point T2: 13.5° C., boiling point T3: 214.5° C.], 2-pyrrolidone [melting point T2: 24.6° C., boiling point T3: 245° C.], and the like.

Examples of the hydrophilic aprotic solvent include dimethyl sulfoxide (DMSO) [melting point T2: 19° C., boiling point T3: 189° C.], N,N-dimethylformamide (DMF) [melting point T2: −61° C., boiling point T3: 153° C.], and the like.

(C) Conductive Organic Polymer Compound

The present invention is characterized in that the conductive organic polymer compound as the component (C) is at least one member selected from polyanilines, polypyrroles, polythiophenes, and derivatives thereof.

The polyanilines, polypyrroles, polythiophenes, and derivatives thereof are a conductive polymer having conductivity by t-electron conjugation.

The polyanilines are a high-molecular weight product of a compound in which aniline is substituted at the 2-position, 3-position, or N-position thereof with an alkyl group, an alkoxy group, or an aryl group each having a carbon number of from 1 to 18, a sulfonic acid group, or the like. Examples thereof include poly(2-methylaniline), poly(3-methylaniline), poly(2-ethylaniline), poly(3-ethylaniline), poly(2-methoxyaniline), poly(3-methoxyaniline), poly(2-ethoxyaniline), poly(3-ethoxyaniline), poly(N-methylaniline), poly(N-propylaniline), poly(N-phenyl-1-naphthylaniline), poly(8-anilino-1-naphthalenesulfonic acid), poly(2-aminobenzenesulfonic acid), poly(7-anilino-4-hydroxy-2-naphthalenesulfonic acid), and the like.

The polypyrroles are a high-molecular weight product of a compound in which pyrrole is substituted at the 1-position, 3-position, or 4-position thereof with an alkyl group or an alkoxy group each having a carbon number of from 1 to 18, or the like. Examples thereof include poly(l-methylpyrrole), poly(3-methylpyrrole), poly(l-ethylpyrrole), poly(3-ethylpyrrole), poly(l-methoxypyrrole), 3-methoxypyrrole, poly(1-ethoxypyrrole), and poly(3-ethoxypyrrole), and the like.

The polythiophenes are a high-molecular weight product of a compound in which thiophene is substituted at the 3-position or 4-position thereof with an alkyl group or an alkoxy group having a carbon number of from 1 to 18, or the like. Examples thereof include high-molecular products such as poly(3-methylthiophene), poly(3-ethylthiophene), poly(3-methoxythiophene), poly(3-ethoxythiophene), and poly(3,4-ethylenedioxythiophene) (PEDOT), and the like.

Examples of derivatives of the polyanilines, polypyrroles, or polythiophenes include dopant products thereof, and the like. Examples of the dopant include halide ions such as a chloride ion, a bromide ion, an iodide ion, etc.; a perchloric acid ion; a tetrafluoroboric acid ion; a hexafluoroarsenic acid ion; a sulfuric acid ion; a nitric acid ion; a thiocyanic acid ion; a hexafluorosilicic acid ion; phosphoric acid based ions such as a phosphoric acid ion, a phenyl phosphate ion, a hexafluorophosphoric acid ion, etc.; a trifluoroacetic acid ion; alkylbenzenesulfonic acid ions such as a tosylate ion, an ethylbenzenesulfonic acid ion, a dodecylbenzenesulfonic acid ion, etc.; alkylsulfonic acid ions such as a methylsulfonic acid ion, an ethylsulfonic acid ion, etc.; and polymer ions such as a polyacrylic acid ion, a polyvinylsulfonic acid ion, a polystyrenesulfonic acid (PSS) ion, a poly(2-acrylamido-2-methylpropanesulfonic acid) ion, etc. These may be used alone or in combination of two or more kinds thereof.

Of these, as a dopant, a polymer ion such as a polyacrylic acid ion, a polyvinylsulfonic acid ion, a polystyrenesulfonic acid (PSS) ion, a poly(2-acrylamido-2-methylpropanesulfonic acid) ion, etc. is preferable relative to the conductive organic polymer compound because it is able to easily adjust the high conductivity, and it has a hydrophilic skeleton useful for being easily dispersed when formed into a water dispersion liquid. A polystyrenesulfonic acid (PSS) ion is more preferable.

Among the foregoing conductive organic polymer compounds, from the viewpoints of easy adjustment of the conductivity and dispersibility, derivatives of polythiophenes are preferable. As such a derivative, for example, a mixture of poly(3,4-ethylene oxide thiophene) and, as a dopant, a polystyrenesulfonic acid ion (hereinafter occasionally referred to as "PEDOT:PSS") and the like are preferable.

The conductive adhesive composition according to the present invention is a composition containing (A) a water-soluble polyvinyl polymer, (B) an organic additive, and (C) a conductive organic polymer compound. When a total amount of the components (A), (B) and (C) is defined as 100 parts by mass, a formulating amount of each of the components (on the basis of the effective ingredients) is from 1 to 60 parts by mass, preferably from 10 to 50 parts by mass, and more preferably from 15 to 40 parts by mass for the component (A); from 0.1 to 90 parts by mass, preferably from 10 to 70 parts by mass, and more preferably from 20 to 65 parts by mass for the component (B); and from 0.1 to 90 parts by mass, preferably from 0.5 to 75 parts by mass, and more preferably from 5 to 55 parts by mass for the component (C), respectively.

In the case where the formulating amount of the component (A) is less than 1 part by mass, the adhesiveness is not revealed, whereas in the case where it reversely exceeds 60 parts by mass, the conductivity is lowered, and hence, the both are not preferable.

In the case where the formulating amount of the component (B) is less than 0.1 part by mass, the conductivity is lowered, whereas in the case where on the contrary, it exceeds 90 parts by mass, the adhesiveness is lowered, and hence, the both are not preferable.

In the case where the formulating amount of the component (C) is less than 0.1 part by mass, the conductivity is lowered, whereas in the case where on the contrary, it exceeds 90 parts by mass, the adhesiveness is not revealed, and hence, the both are not preferable.

In addition, in the present invention, the foregoing conductive adhesive composition may also be a solution in which a solvent such as water, toluene, ethyl acetate, methyl ethyl ketone, etc. is further formulated together with the components (A), (B) and (C). Above all, in view of solubility of the components (A), (B) and (C), it is preferable that the solution is an aqueous solution. In view of handling, a concentration of the effective ingredients is preferably from 0.5 to 80% by mass, and more preferably from 1 to 70% by mass.

In addition to the foregoing components (A), (B) and (C), if desired, a tackifier, a plasticizer, a thickener, a wetting agent, a defoaming agent, a film-forming auxiliary, an antiseptic, an anticorrosive, a freezing and thawing stabilizer, a pigment, a colorant, a filler, a metal powder, an antioxidant, a light stabilizer, an ultraviolet ray absorber, and the like can be properly added to the conductive adhesive composition according to the present invention.

[2] Electronic Device:

The electronic device according to the present invention comprises a conductive layer composed of the conductive adhesive composition.

A thickness of the conductive layer composed of the foregoing conductive adhesive composition is preferably from 5 to 10,000 nm, and more preferably from 30 to 3,000 nm. When the thickness of the conductive layer is less than 5 nm, the adhesiveness is not revealed, whereas when it exceeds 10,000 nm, the conductivity is lowered.

The conductive layer has high conductivity such that it is applicable to an electronic device. A surface resistivity of such a conductive layer is preferably from 1 to $1.0 \times 10^{10}$ Ω/□, more preferably from 1 to $1.0 \times 10^{9}$ Ω/□, and still more preferably 1 to $1.0 \times 10^{8}$ Ω/□. When the surface resistivity of the conductive layer exceeds $1.0 \times 10^{10}$ Ω/□, the conductivity is lowered, and the performance as an electronic device is deteriorated. When the surface resistivity of the conductive layer falls within the foregoing range, the conductive layer is suitable for various electronic devices.

The conductive layer composed of the foregoing conductive adhesive composition is high in terms of transparency, and its total light transmittance is 70% or more. When the total light transmittance falls within this range, in particular, the conductive layer is sufficient in terms of transparency as conductive layers of various electronic devices such as organic electroluminescence (hereinafter referred to as "organic EL") elements, solar cells, etc., and it is suitably used.

Specific examples of the electronic device include, in addition to the organic EL and solar cells, various electronic devices such as organic devices, e.g., organic transistors, organic memories, etc.; liquid crystal displays; electronic papers; thin-film transistors; electrochromics; electrochemical light-emitting devices; touch panels; displays; thermoelectric conversion devices; piezoelectric conversion devices; accumulation devices of electricity; organic photoelectric conversion elements; etc.

In addition, the electronic device according to the present invention comprises a anodic layer, the foregoing conductive layer, a photoelectric conversion layer or a light-emitting layer, and an cathodic layer arranged in this order.

Examples of such an electronic device include various electronic devices such as organic solar cells, photodiodes, and organic EL, etc.

Each of layers constituting the electronic device according to the present invention is hereunder described by reference to FIG. 1(a).

In FIG. 1(a), 1 stands for a anodic layer; 4 stands for a conductive layer; 3 stands for a photoelectric conversion layer or a light-emitting layer; and 2 stands for an cathodic layer.

<Photoelectric Conversion Layer>

The photoelectric conversion layer is a layer serving as the center of an organic photoelectric conversion element and receiving a photoelectric effect, and it may be composed of a single layer or plural layers. In the case of a single layer, the photoelectric conversion layer is usually formed of an intrinsic semiconductor layer (i-type semiconductor).

In the case of plural layers, the photoelectric conversion layer is a (p-type semiconductor layer/n-type semiconductor layer) laminate, a (p-type semiconductor layer/intrinsic semiconductor layer/n-type semiconductor layer) laminate, or the like.

The photoelectric conversion layer is a layer for achieving the photoelectric conversion, and it is preferably composed of an organic semiconductor from the viewpoints of cost reduction of raw materials, flexibility, easiness of formation, height of extinction coefficient, weight reduction, impact resistance, and the like.

The intrinsic semiconductor layer as referred to herein is formed of an organic layer having a p-n junction interface, which is composed of an electron donating material (p-type semiconductor material as described later) and an electron accepting material (n-type semiconductor material as described later). FIG. 11(a) shows an intrinsic semiconductor layer composed of a single layer.

Though a thickness of the photoelectric conversion layer differs depending upon whether the photoelectric conversion layer is composed of a single layer or plural layers, from the viewpoints of conductivity and exciton diffusion distance, in general, it is preferably from 30 nm to 2 m, and especially preferably from 40 nm to 300 nm.

The semiconductor material which is used in the photoelectric conversion layer is hereunder described.

(1) Intrinsic Semiconductor

As a material of the intrinsic semiconductor, for example, a mixture obtained by mixing a first material composed of at least one member of fullerene, a fullerene derivative, a carbon nanotube (CNT) having semiconductor properties, and a CNT compound, and a second material composed of a derivative of polyphenylene vinylene (PPV) or a polythiophene based polymer material such that the obtained semiconductor becomes an intrinsic semiconductor, can be used.

As the fullerene derivative, for example, [6,6]-phenyl-C61-butyric acid methyl ester (PCBM) and the like can be used, and a dimer of fullerene or a fullerene compound having an alkali metal or an alkaline earth metal, etc. introduced thereinto, and the like can also be used. In addition, as CNT, a carbon nanotube having fullerene or metal-included fullerene included therein, and the like can be used. Furthermore, a CNT compound in which a molecule of every sort is added to the side wall or tip of CNT, and the like can also be used.

As the derivative of polyphenylene vinylene, poly[2-methoxy-5-(2'-ethyl-hexyloxy)-p-phenylene-vinylene](MEH-PPV) and the like can be used; and as the polythiophene based polymer material, a poly(3-alkylthiophene) such as poly-3-hexylthiophene (P3HT), etc., a dioctylfluorene-bithiophene copolymer (F8T2), and the like can be used.

As an especially preferred intrinsic semiconductor, there is exemplified a mixture obtained by mixing PCBM and P3HT in a mass ratio of from 1/0.3 to 1/4.

(2) p-Type Semiconductor

Examples of a material of the p-type semiconductor include polyalkylthiophenes such as poly-3-hexylthiophene (P3HT), etc. and derivatives thereof, polyphenylene and derivatives thereof, polyphenylene vinylenes such as poly[2-methoxy-5-(2'-ethyl-hexyloxy)-p-phenylene-vinylene] (MEH-PPV), etc., and derivatives thereof, polysilane and derivatives thereof, porphyrin derivatives, phthalocyanine derivatives, polyalkylthiophenes and derivatives thereof, organic metal polymers, and the like. Above all, polyalkylthiophenes and derivatives thereof are preferable. In addition, mixtures of those organic materials may also be used. As the conductive polymer, poly(3,4-ethylenedioxythiophene)/polystyrenesulfonate (PEDOT:PSS) can be preferably used.

(3) n-Type Semiconductor

A material of the n-type semiconductor is not particularly limited, and examples thereof include 1,4,5,8-naphthalenetetracarboxylic dianhydride (NTCDA), 3,4,9,10-perylenetetracarboxylic dianhydride (PTCDA), 3,4,9,10-perylenetetracarboxylic bisbenzimidazole (PTCBI), N,N'-dioctyl-3,4,9,10-naphthyltetracarboxydiimide (PTCDI-C8H), oxadiazole derivatives such as 2-(4-biphenylyl)-5-(4-t-butylphenyl)-1,3,4-oxadiazole (PBD), 2,5-di(1-naphthyl)-1,3,4-oxadiazole (BND), etc., triazole derivatives such as 3-(4-biphenylyl)-4-phenyl-5-(4-t-butylphenyl)-1,2,4-triazole (TAZ), etc., phenanthroline derivatives, phosphine oxide derivatives, fullerene compounds, carbon nanotubes (CNT), CNT compounds in which a molecule of every sort is added to the side wall or tip of CNT, derivatives in which a cyano group is introduced into a poly-p-phenylene vinylene based polymer (CN-PPV), and the like.

Of those, fullerene compounds are especially preferable because they are an n-type semiconductor which is stable and high in terms of carrier mobility.

As the fullerene compound, for example, [6,6]-phenyl-C61-butyric acid methyl ester PCBM and the like can be used. In addition, examples thereof include a dimer of fullerene, a fullerene compound having an alkali metal or an alkaline earth metal introduced thereinto, and the like. Of these, PCBM is preferable from the viewpoint that it has excellent electron acceptance.

Incidentally, such an n-type semiconductor can be used alone or in combination of two or more kinds thereof.

<Light-Emitting Layer>

In the electronic device according to the present invention, when a light-emitting layer is laminated instead of the photoelectric conversion layer, the electronic device can be used as an organic EL element.

For the light-emitting layer, so far as a light-emitting organic compound which produces an exciton upon recombination of an electron and a hole, and when the exciton releases energy and returns into a ground state, causes light emission is concerned, it can be used without particular limitations. In general, the light-emitting organic compound is formed of an organic material capable of emitting fluorescence, an organic material capable of emitting phosphorescence, or the subject organic material and a dopant capable of assisting it.

In addition, for the purpose of increasing charge transporting properties of the foregoing light-emitting layer, an electron transporting compound and/or a hole transporting compound may be mixed in the foregoing light-emitting layer and used.

Examples of a material which is used for the light-emitting layer include light-emitting materials such as metal complex based materials, polymer based materials, colorant based materials, and dopant materials, etc.

Examples of the metal complex based material include aluminum complexes, beryllium complexes, zinc complexes, aluminoquinolinol complexes, europium complexes, iridium complexes, benzoquinolinol beryllium complexes, benzoxazolyl zinc complexes, benzothiazole zinc complexes, azomethyl zinc complexes, porphyrin zinc complexes, and organic metal complex compounds such as rare earth metal complexes, etc.

Examples of the polymer based material include poly-p-phenylene vinylene derivatives, polythiophene derivatives, poly-p-phenylene derivatives, polysilane derivatives, polyacetylene derivatives, polyfluorene derivatives, polyvinylcarbazole derivatives, and the like.

Examples of the colorant based material include cyclopendamine derivatives, tetraphenylbutadiene derivative compounds, triphenylamine derivatives, oxadiazole derivatives, pyrazoloquinoline derivatives, distylylbenzene derivatives, distylylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, coumarin derivatives, and the like.

Examples of the dopant material include perylene derivatives, coumarin derivatives, rubrene derivatives, quinacridone derivatives, squarylium derivatives, porphyrin derivatives, styryl basedcolorant, tetracene derivatives, pyrazolone derivatives, decacyclene, phenoxazone, and the like.

As for a method for forming the light-emitting layer, a vacuum vapor deposition method, an ionized vapor deposition method, and various coating methods such as spin coating (spin casting method), spray coating, gravure coating, bar coating, doctor blade coating, etc. can be properly selected and adopted according to the foregoing light-emitting material. It is preferable that the light-emitting layer is formed by a coating method.

A thickness of the light-emitting layer is from 1 to 100 m, preferably from 2 to 1,000 nm, more preferably from 5 nm to 500 nm, and still more preferably from 20 nm to 200 nm.

<Anodic Layer>

As for a material of the anodic layer, those having a small energy barrier to an HOMO level of the p-type organic semiconductor and a relatively large work function are preferable.

In addition, materials capable of forming a transparent anodic layer are preferable, and examples of such a material include metal oxides.

Examples of the metal oxide include tin-doped indium oxide (ITO), iridium oxide ($IrO_2$), indium oxide ($In_2O_3$), tin oxide ($SnO_2$), fluorine-doped tin oxide (FTO), indium oxide-zinc oxide (IZO), zinc oxide (ZnO), gallium-doped zinc oxide (GZO), aluminum-doped zinc oxide (AZO), molybdenum oxide ($MoO_3$), titanium oxide ($TiO_2$), and the like.

From the viewpoint of a balance between transparency and conductivity, a thickness of the anodic layer is preferably from 10 to 500 nm, and especially preferably from 30 to 300 nm.

A method for forming the anodic layer is not particularly limited, and for example, a method such as vacuum vapor deposition, sputtering of every sort, etc. can be adopted.

<Cathodic Layer>

Though a material of the cathodic layer is not particularly limited so far as it functions as an electrode, those having a small energy barrier to an LUMO level of the n-type semiconductor and a relatively small work function are preferable. Examples thereof include, in addition to metals, metal oxides, or alloys such as platinum, gold, silver, copper, aluminum, iridium, chromium, zinc oxide, etc., carbon nanotubes, and composites of a carbon nanotube and the foregoing metal, metal oxide or alloy.

A thickness of the cathodic layer is preferably from 20 nm to 1 μm, and especially preferably from 30 to 200 nm.

A method for forming the cathodic layer is not particularly limited, and for example, a method such as vacuum vapor deposition, sputtering of every sort, etc. can be applied.

In the electronic device according to the present invention, it is preferable that the foregoing anodic layer and cathodic layer are both provided on a base material.

[Base Material]

As for the base material, though the material can be properly selected according to an application, in general, an inorganic material such as glass (plate), etc. or a plastic film is used as the base material.

Examples of the plastic film include films made of a resin such as polyethylene terephthalate, polyethylene naphthalate, tetraacetyl cellulose, syndiotactic polystyrene, polyphenylene sulfide, polycarbonates, polyarylates, polysulfone, polyestersulfone, polyetherimide, cyclic polyolefins, etc. Above all, those which are excellent in terms of mechanical strength, durability, and the like are preferable.

In view of mechanical strength and durability, a thickness of the base material is in general from 3 μm to 5 mm, preferably from 10 μm to 1 mm, and especially preferably from 20 μm to 300 μm.

[4] Manufacturing Method of Electronic Device

The manufacturing method of the electronic device according to the present invention comprises a step of forming a conductive layer composed of the foregoing conductive adhesive composition on a anodic layer to form a anodic laminate, a step of forming the foregoing photoelectric conversion layer or light-emitting layer on an cathodic layer to form an cathodic laminate, and sticking a surface of the photoelectric conversion layer or light-emitting layer in the foregoing cathodic laminate and a surface of the conductive layer in the foregoing anodic laminate to each other at a temperature at which the foregoing conductive adhesive composition is softened or higher.

The manufacturing method of the electronic device according to the present invention is hereunder described successively by reference to FIG. 1(b).

An integrated material of the anodic layer 1 and the conductive layer 4 is called a anodic laminate (as described later). An integrated material of the cathodic layer 2 and the photoelectric conversion layer or light-emitting layer 3 is called an cathodic laminate (as described later).

Downward arrows express that the anodic laminate and the cathodic laminate are compressively bonded and integrated under heating, thereby forming an electronic device.

[Anodic Laminate]

The anodic laminate is composed of a material in which the foregoing conductive layer 4 composed of the conductive adhesive composition according to the present invention is formed on the anodic layer 1.

In general, the anodic layer is formed on a base material.

Examples of a method for providing the cathode on the base material include dry processes such as PVD (physical vapor deposition), e.g., vacuum vapor deposition, sputtering, ion plating, etc., CVD (chemical vapor deposition), e.g., thermal CVD, atomic layer deposition (ALD), etc.; and wet processes such as coating of every sort, e.g., dip coating, spin coating, spray coating, bar coating, gravure coating, die coating, and doctor blade coating, etc., electrochemical deposition, etc. The method is properly selected according to the material of the anodic layer.

As for a formation method for forming the conductive layer on the anodic layer, the formation can be achieved by coating a conductive layer forming a solution having the conductive adhesive composition dissolved or dispersed in an appropriate solvent such as purified water, etc. onto the anodic layer, drying the obtained coated film, and if desired, by further heating it to such an extent that the organic additive in the conductive adhesive composition does not volatilize. Examples of the formation method include wet processes such as coating of every sort, e.g., dip coating, spin coating, spray coating, bar coating, gravure coating, die coating, doctor blade coating, etc., electrochemical deposition, etc., and the formation method is properly selected.

[Cathodic_Laminate]

The cathodic laminate is composed of a material in which the foregoing photoelectric conversion layer or light-emitting layer 3 is formed on the foregoing cathodic layer 2.

In general, the cathodic layer 2 is provided on a base material.

Examples of a method for providing the anodic layer on the base material include dry processes such as PVD (physical vapor deposition), e.g., vacuum vapor deposition, sputtering, ion plating, etc., CVD (chemical vapor deposition), e.g., thermal CVD, atomic layer deposition (ALD), etc. The method is properly selected according to the material of the cathodic layer.

Examples of a formation method for forming the photoelectric conversion layer or light-emitting layer on the cathodic layer include dry processes such as PVD (physical vapor deposition), e.g., vacuum vapor deposition, sputtering, ion plating, etc., CVD (chemical vapor deposition), e.g., thermal CVD, atomic layer deposition (ALD), etc.; and wet processes such as coating of every sort, e.g., dip coating, spin coating, spray coating, gravure coating, bar coating, doctor blade coating, etc., electrochemical deposition, etc. The method is properly selected according to the material of the photoelectric conversion layer or light-emitting layer.

A temperature at which the foregoing conductive adhesive composition is softened is a temperature of the glass transition temperature (Tg) of the component (A) or higher. In view of easiness of manufacture, a processing temperature at the time of sticking is specifically about 100° C.

As for the manufacturing method of the electronic device according to the present invention, since the surface of the conductive layer composed of the conductive adhesive composition according to the present invention and the surface of the photoelectric conversion layer or light-emitting layer are stuck, the electronic device can be easily manufactured by a lamination process.

In addition, according to this method, after forming the photoelectric conversion layer or light-emitting layer, a step of forming a metal layer as the cathodic layer does not exist, whereby, the metal layer does not becomes non-uniform, or the photoelectric conversion layer or light-emitting layer is not damaged by the energy at the time of film formation of the metal layer. Therefore, the performance of the electronic device is not lowered.

EXAMPLES

The present invention is hereunder described in more detail with reference to the following Examples and Comparative Examples, but it should be construed that the present invention is not limited thereto at all.

Example 1

Preparation of Conductive Adhesive Composition

As for the water-soluble polyvinyl polymer as the component (A), 50 parts by mass of polyvinyl alcohol [a product name: Polyvinyl Alcohol, manufactured by Sigma-Aldrich Co., molecular weight Mw=9,100, Tg (T1): 50° C.; which is described as "PVA" in Table 1] was used. As for the organic additive as the component (B), 50 parts by mass of glycerin [a product name: Glycerin, manufactured by Sigma-Aldrich Co., melting point (T2): 18° C., boiling point (T3): 290° C.] was used. As for a polythiophene that is the conductive polymer as the component (C), 10,000 parts by mass of a mixture (PEDOT:PSS) [a product name: Clevious P VP.AI4083, manufactured by H.C. Starck, effective ingredient: 1% by mass; which is described as "Polythiophene" in Table 1] of poly(3,4-ethylene oxide thiophene) (PEDOT) and polystyrenesulfonic acid (PSS) was used.

The foregoing components (A), (B) and (C) were dissolved in 200 parts by mass of purified water, thereby preparing a coating solution of a conductive adhesive composition (effective ingredient: 1.9% by mass).

[Fabrication of a Anodic Laminate]

An ITO glass [a product name: ITO Glass, manufactured by Techno Print Co., Ltd.] in which a tin-doped indium oxide (ITO) had been subjected to sputtering so as to have a thickness of 150 nm was used as a anodic layer.

Subsequently, the thus obtained coating solution of conductive adhesive composition was coated on the foregoing anodic layer by a spin coating method and then dried at 100° C. for 30 minutes, thereby forming a conductive layer composed of the conductive adhesive composition and having a thickness of 100 nm.

[Fabrication of an Cathodic Laminate]

On a polyethylene terephthalate film [a product name: Cosmoshine A4100, manufactured by Toyobo Co., Ltd.] as a base material, aluminum was subjected to film formation into an aluminum layer having a thickness of 100 nm under reduced pressure of not more than $1 \times 10^{-3}$ Pa by a vapor deposition method, thereby forming an cathodic layer.

Subsequently, as for a photoelectric conversion layer, a chlorobenzene solution (concentration: 2%) of a mixture of poly-3-hexylthiophene (P3HT) and [6,6]-phenyl-C61-butyric acid methyl ester (PCBM) in a mass ratio of 1/0.8 was coated by a spin casting method and then dried at 120° C. for 10 minutes, thereby forming an intrinsic semiconductor layer having a thickness of 100 nm.

[Fabrication of an Electronic Device (Solar Cell)]

A surface of the conductive layer in the obtained anodic laminate and a surface of the photoelectric conversion layer in the cathodic laminate were compressively bonded and stuck upon heating a roll laminator [a product name: RSL-328S, manufactured by Royal Sovereign] at a roller temperature of 120° C., thereby obtaining an electronic device.

Examples 2 and 3

Electronic devices were obtained in the same manner as that in Example 1, except for changing the formulation as shown in the following Table 1.

Example 4

An electronic device was obtained in the same manner as that in Example 1, except for changing the organic additive as the component (B) to N-methylpyrrolidone [manufactured by WakoPure Chemical Industries, Ltd., melting point (T2): −24° C., boiling point (T3): 202° C.] and changing the formulation as shown in the following Table 1.

Example 5

An electronic device was obtained in the manner as that in Example 1, except for changing PVA as the component (A) to polyvinylpyrrolidone [manufactured by Sigma-Aldrich Co., Tg (T1): 80° C.; which is described as "PVP" in Table 1] and changing the formulation as shown in the following Table 1.

Example 6

An electronic device was obtained in the manner as that in Example 1, except for changing PVA as the component (A) to polyvinylpyrrolidone [manufactured by Sigma-Aldrich Co., Tg (T1): 80° C.], changing the organic additive as the component (B) to N-methylpyrrolidone [melting point (T2): −24° C., boiling point (T3): 202° C.], and changing the formulation as shown in the following Table 1.

Example 7

An electronic device was obtained in the same manner as that in Example 1, except for changing the organic additive as the component (B) to dimethyl sulfoxide [manufactured by Wako Pure Chemical Industries, Ltd., melting point (T2): 19° C., boiling point (T3): 189° C.; which is described as "DMSO" in Table 1] and changing the formulation as shown in the following Table 1.

Example 8

An electronic device was obtained in the same manner as that in Example 1, except for changing the organic additive as the component (B) to dimethylformamide [manufactured by WakoPure Chemical Industries, Ltd., melting point (T2): −61° C., boiling point (T3): 153° C.; which is described as "DMF" in Table 1] and changing the formulation as shown in the following Table 1.

Example 9

An electronic device was obtained in the same manner as that in Example 1, except for changing the conductive organic polymer compound as the component (C) to, as a polyaniline, polyaniline [manufactured by Sigma-Aldrich Co., effective ingredient: 1% by mass; which is described as "Polyanilines 1" in Table 1] and changing the formulation as shown in the following Table 1.

Example 10

An electronic device was obtained in the same manner as that in Example 1, except for changing the conductive organic polymer compound as the component (C) to, as a polypyrrole, polypyrrole [manufactured by Sigma-Aldrich Co., effective ingredient: 1% by mass; which is described as "Polypyrroles" in Table 1].

Comparative Examples 1 to 7

Electronic devices were obtained in the same manner as that in Example 1, except for changing each of the formulations of the components (A), (B) and (C) as shown in the following Table 1.

Respective physical properties of the conductive layers and electronic devices obtained in Examples 1 to 10 and respective physical properties of the conductive layers obtained in Comparative Examples 1 to 7 are shown in Table 1.

Example 11

Preparation of a Conductive Adhesive Composition

As for the water-soluble polyvinyl polymer as the component (A), 45 parts by mass of an acrylic acid polymer [a product name: Polyacrylic Acid, manufactured by Sigma-Aldrich Co., weight average molecular weight: 100,000, effective ingredient: 40% by mass, Tg (T1): 102° C.; which is described as "PAA" in Table 2] was used as an effective ingredient. As for the organic additive as the component (B), 90 parts by mass of glycerin [a product name: Glycerin, manufactured by Sigma-Aldrich Co., melting point (T2): 18° C., boiling point (T3): 290° C.] was used. As for a polythiophene that is the conductive polymer as the component (C), 1,500 parts by mass (15 parts by mass as an effective ingredient) of a mixture (PEDOT:PSS) of poly(3,4-ethylene oxide thiophene) (PEDOT) and polystyrenesulfonic acid (PSS) [a product name: Clevious PVP.AI4083, manufactured by H.C. Starck, effective ingredient: 1% by mass; which is described as "Polythiophenes" in Table 2] was used. The foregoing components (A), (B) and (C) were dissolved in 200 parts by mass of purified water, thereby preparing a coating solution of a conductive adhesive composition (effective ingredient: 7.8% by mass).

[Fabrication of a Anodic Laminate]

A anodic laminate was fabricated in the same manner as that in Example 1, except for changing the formulation as shown in the following Table 2 and changing the thickness of the conductive layer to 1,000 nm.

[Fabrication of an Electronic Device (Solar Cell)]
[Fabrication of an Cathodic Laminate]

The same procedures as those in Example 1 were followed, except for changing the formulation of the conductive layer as shown in the following Table 2 and forming an intrinsic semiconductor layer having a thickness of 1,000 nm as the photoelectric conversion layer to form a photoelectric conversion layer in the cathodic laminate.

A surface of the conductive layer in the obtained anodic laminate and a surface of the photoelectric conversion layer in the cathodic laminate were compressively bonded and stuck upon heating a roll laminator [a product name: RSL-328S, manufactured by Royal Sovereign] at a roller temperature of 100° C., thereby obtaining an electronic device (solar cell).
[Fabrication of an Electronic Device (Organic EL Element)]
[Fabrication of an Cathodic Laminate]

On a polyethylene terephthalate film [a product name: Cosmoshine A4100, manufactured by Toyobo Co., Ltd.] as a base material, silver was subjected to film formation in a thickness of 100 nm under reduced pressure of not more than $1 \times 10^{-3}$ Pa by a vapor deposition method, and subsequently, magnesium was subjected to vapor deposition in a thickness of 10 nm, thereby forming an cathodic layer.

Subsequently, poly(2-methoxy-5-(3',7'-dimethyl octyloxy)-1,4-phenylene-vinylene) [a product name: MDMO-PPV], manufactured by Luminescence Technology Corp. was dissolved (concentration: 1% by mass) in xylene, and the solution was coated by a spin casting method and then dried at 100° C. for 10 minutes, thereby forming a light-emitting layer having a thickness of 100 nm.

[Fabrication of an Electronic Device (Organic EL Element) by Sticking]

A surface of a conductive layer in a anodic laminate obtained in the same manner as that in Example 1, except for changing the formulation as shown in the following Table 2 and changing the thickness of the conductive layer to 1,000 nm. And a surface of the light-emitting layer in the cathodic laminate were compressively bonded and stuck upon heating a roll laminator [a product name: RSL-328S, manufactured by Royal Sovereign] at a roller temperature of 100° C., thereby obtaining an electronic device (organic EL element).

Examples 12 and 13

Electronic devices (solar cells and organic EL elements) were obtained in the same manner as that in Example 11, except for changing the formulation as shown in the following Table 2.

Examples 14 to 15 and 17

Electronic devices (solar cells and organic EL elements) were obtained in the same manner as that in Example 11, except for changing the formulation as shown in the following Table 2.

Example 16

An electronic device was obtained in the same manner as that in Example 1, except for changing the conductive organic polymer compound as the component (C) to, as a polyaniline, polyaniline [a product name: D1033W, manufactured by Nissan Chemical Industries, Ltd.; which is described as "Polyanilines 2" in Table 2] and changing the formulation as shown in the following Table 1.

Comparative Examples 8 to 15

Electronic devices (solar cells and organic EL elements) were obtained in the same as that in Example 11, except for changing each of the formulations of the components (A), (B) and (C) as shown in the following Table 2 and changing the thickness of the conductive layer as shown in the following Table 2. However, in Comparative Examples 11 to 14, the surface of the conductive layer in the anodic laminate and the surface of the photoelectric conversion layer or light-emitting layer in the cathodic laminate could not be stuck, so that an electronic device could not be fabricated.

Respective physical properties of the conductive layers and electronic devices obtained in Examples 11 to 17 and Comparative Examples 8 to 10 and 15 are shown in Table 2.

The materials used in Examples 1 to 17 and Comparative Examples 1 to 15 are summarized and described below.
(1) Acrylic Acid Polymer (Described as "PAA" in Table 2):
Product name: Polyacrylic Acid, manufactured by Sigma-Aldrich Co.
(3) Glycerin:
Product name: Glycerin, manufactured by Sigma-Aldrich Co.
(4) N-Methylpyrrolidone:
Product name: N-Methylpyrrolidone, manufactured by Wako Pure Chemical Industries, Ltd.
(5) Dimethyl Sulfoxide (Described as "DMSO" in Table 2):
Product name: Dimethyl Sulfoxide, manufactured by Wako Pure Chemical Industries, Ltd.
(6) N,N-Dimethylformamide (Described as "DMF" in Table 2):
Product name: N,N-Dimethylformamide, manufactured by Wako Pure Chemical Industries, Ltd.
(7) Polythiophenes:
Product name: Clevious P VP.AI4083, manufactured by H.C. Starck
(8) Polyanilines 1:
Product name: Polyaniline (Example 9), manufactured by Sigma-Aldrich Co.
Polyanilines 2:
Product name: D1033W (Example 16), manufactured by Nissan Chemical Industries, Ltd.
(9) Polypyrroles:
Product name: Polypyrrole, manufactured by Sigma-Aldrich Co.

The characteristics described in Tables 1 and 2 were measured in the following manners.
(1) Thickness of Conductive Layer:
A thickness of the conductive layer composed of the conductive adhesive composition was measured by a stylus surface profilometer [a product name: Dektak 150, manufactured by Veeco].
(2) Surface Resistance Value:
As for the surface of the conductive layer in the obtained anodic laminate, a surface resistance value of the conductive layer was measured by the four-probe method with a surface resistance meter [a product name: Loresta GP MCP-T600, manufactured by Mitsubishi Chemical Corporation].
(3) Total Light Transmittance:
As for the obtained anodic laminate, a total light transmittance was measured with a light transmittance meter [a product name: NDH-5000, manufactured by Nippon Denshoku Industries Co., Ltd.] in conformity with JIS K7631-1, and the measured value was defined as a total light transmittance of the conductive layer.
(4) Adhesiveness:
The coating solution of conductive adhesive composition obtained in each of the Examples and Comparative Examples was coated on a polyethylene terephthalate film [a product name: Cosmoshine A4100, manufactured by Toyobo Co., Ltd., thickness: 100 μm] and then dried at 100° C. for 10 minutes, thereby forming a conductive layer composed of the conductive adhesive composition and having a thickness of 100 nm. There was thus fabricated a sample for measurement (5×5 cm).

The obtained sample for measurement was stuck onto a glass plate (25 mm×25 mm, thickness: 1 mm) at a temperature of 120° C. by using a laminator [a product name: RSL-328J, manufactured by Royal Sovereign]. Thereafter, after cooling to ordinary temperature, the sample for measurement was vertically aligned and examined on whether it adheres or not.

The "evaluation of sticking" was made according to the following criteria and described in Tables 1 and 2.

◯: The sample for measurement does not drop from the glass plate and adheres.

x: The sample for measurement dropped from the glass plate without adhering.

(5) Adhesive Force:

As for the adhesive force described in Table 2, the coating solution of conductive adhesive composition obtained in each of Examples 11 to 17 and Comparative Examples 8 to 10 was coated on a polyethylene terephthalate film [a product name: Cosmoshine A4100, manufactured by Toyobo Co., Ltd., thickness: 100 μm] and then dried at 100° C. for 10 minutes, thereby forming a conductive layer composed of the conductive adhesive composition and having a thickness of 1,000 nm. There was thus fabricated a sample for measurement.

The obtained sample for measurement was cut into a size of 25 mm×300 mm in an environment at 23° C. and 50% RH (relative humidity) in conformity with JIS Z0237 (2009), and the resulting sample for measurement was stuck onto an adherend (glass plate, 800 mm×1,500 mm, thickness: 3 mm) at a temperature of 100° C. by using a laminator [a product name: RSL-328J, manufactured by Royal Sovereign]. An adhesive force at a point of time of elapsing 24 hours after sticking was measured at a tensile rate of 300 mm/min by the 180-degree peeling method.

(6) Glass Transition Temperature:

The glass transition temperature T1 of the water-soluble vinyl polymer as the component (A) was determined by measuring initiation temperature of an extrapolated glass transition in a temperature range of from −80° C. to 250° C. with an input compensation type differential scanning calorimeter [an apparatus name: Pyris1 DSG, manufactured by PerkinElmer] in conformity with JIS K7121.

[Evaluation of an Electronic Device (Solar Cell)]

As for each of the electronic devices obtained in the Examples and Comparative Examples, a current-voltage characteristic was measured using a source measure unit [manufactured by Wacom Electric Co., Ltd.], and the obtained commutation curve was observed.

◯: Commutation properties are revealed.

x: Commutation properties are not revealed (the device does not function as an electronic device due to poor sticking).

Figure 2:
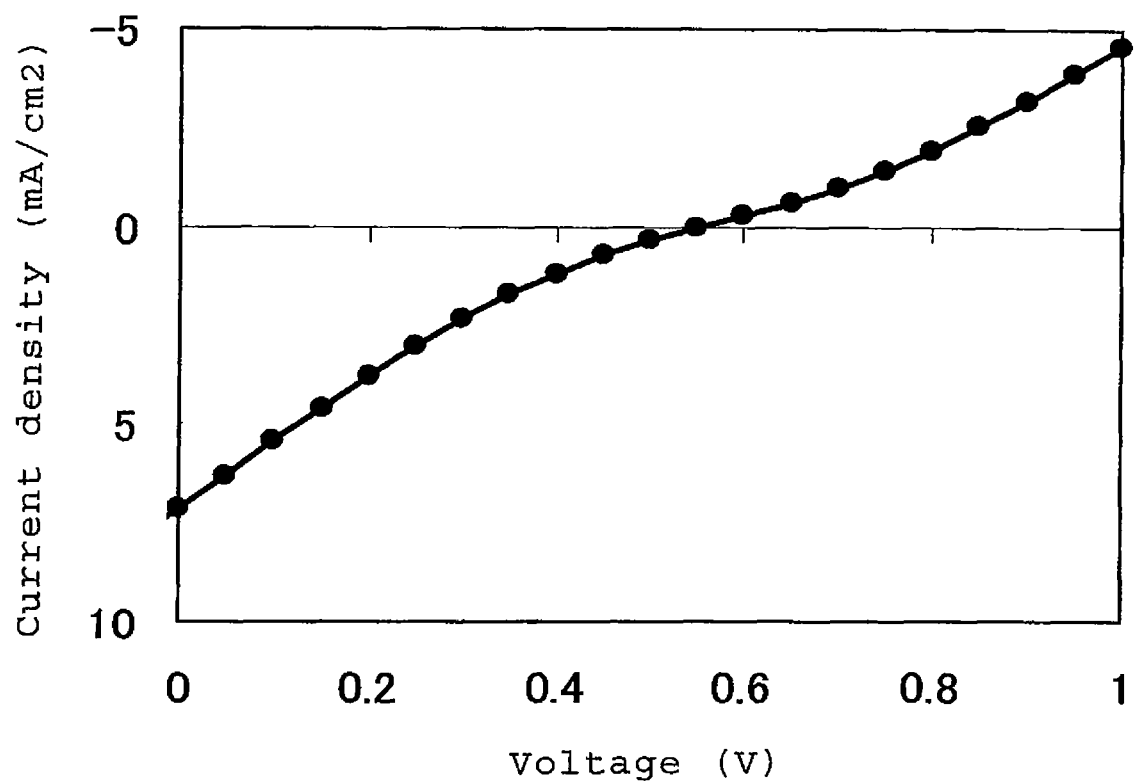
FIG. 2 is a graph showing a relationship between a current density and a voltage in a solar cell that is one of electronic devices according to the present invention.

A current density-voltage curve obtained regarding the electronic device (solar cell) obtained by the formulation of Example 11 is shown in FIG. 2.

[Evaluation Method of an Electronic Device (Organic EL Element)]

As for the current-voltage characteristic of the electronic device (organic EL element) obtained in each of Examples 11 to 17 and Comparative Examples 8 to 10 and 15, the current-voltage characteristic was measured using an organic EL luminance efficiency measurement system [a product name: EL1003, manufactured by PRECISE GAUGES], and the obtained commutation curve was observed.

◯: Commutation properties are revealed.

x: Commutation properties are not revealed (the device does not function as an electronic device due to poor sticking).

In addition, a luminance (cd/cm$^2$) of the electronic device (organic EL element) at the time of voltage impression was measured using a luminance meter [a product name: LS-110, manufactured by Konica Minolta Corporation]. The results are shown in Table 2.

TABLE 1

| | (A) | | (B) | | | | (C) | | |
|---|---|---|---|---|---|---|---|---|---|
| | PVA (parts) | PVP (parts) | Glycerin (parts) | N-Methyl-pyrrolidone (parts) | DMSO (parts) | DMF (parts) | Polythiophene (parts) | Polyaniline 1 (parts) | Polypyrrole (parts) |
| Example | | | | | | | | | |
| 1 | 50 (25) | — | 50 (25) | — | — | — | 100 (50) | — | — |
| 2 | 25 (14.7) | — | 25 (14.7) | — | — | — | 120 (70.6) | — | — |
| 3 | 50 (27.8) | — | 100 (55.6) | — | — | — | 30 (16.6) | — | — |
| 4 | 25 (12.19) | — | — | 80 (39.01) | — | — | 100 (48.8) | — | — |
| 5 | — | 50 (20) | 100 (40) | — | — | — | 100 (40) | — | — |
| 6 | — | 50 (20) | — | 100 (40) | — | — | 100 (40) | — | — |
| 7 | 50 (20) | — | — | — | 100 (40) | — | 100 (40) | — | — |
| 8 | 50 (20) | — | — | — | — | 100 (40) | 100 (40) | — | — |
| 9 | 50 (20) | — | — | 100 (40) | — | — | — | 100 (40) | — |
| 10 | 50 20) | — | — | 100 (40) | — | — | — | — | 100 (40) |
| Comparative Example | | | | | | | | | |
| 1 | 100 (77) | — | — | — | — | — | 30 (23) | — | — |
| 2 | 50 (62.5) | — | — | — | — | — | 30 (37.5) | — | — |
| 3 | 50 (100) | — | — | — | — | — | — | — | — |
| 4 | — | 50 (100) | — | — | — | — | — | — | — |
| 5 | — | — | 100 (100) | — | — | — | — | — | — |
| 6 | — | — | — | 100 (100) | — | — | — | — | — |
| 7 | — | — | — | — | — | — | 15 (100) | — | — |

| | Film thickness of conductive layer (nm) | Surface resistance (Ω/□) | Total light transmittance (%) | T1 (° C.) | T2 (° C.) | T3 (° C.) | Evaluation of electronic device (solar cell) | Evaluation of sticking (adhesiveness) |
|---|---|---|---|---|---|---|---|---|
| Example | | | | | | | | |
| 1 | 100 | 4.50E+08 | 88 | 50 | 18 | 290 | ◯ | ◯ |
| 2 | 100 | 3.20E+08 | 89 | 50 | 18 | 290 | ◯ | ◯ |
| 3 | 100 | 4.50E+07 | 88 | 50 | 18 | 290 | ◯ | ◯ |
| 4 | 100 | 3.20E+07 | 89 | 50 | −24 | 202 | ◯ | ◯ |
| 5 | 100 | 1.70E+08 | 89 | 80 | 18 | 290 | ◯ | ◯ |
| 6 | 100 | 7.70E+07 | 88 | 80 | −24 | 202 | ◯ | ◯ |

TABLE 1-continued

| | | | | | | | | | |
|---|---|---|---|---|---|---|---|---|---|
| 7 | 100 | 1.80E+07 | 88 | 50 | 19 | 189 | ○ | ○ | |
| 8 | 100 | 2.30E+07 | 88 | 50 | −61 | 153 | ○ | ○ | |
| 9 | 100 | 3.20E+07 | 87 | 50 | −24 | 202 | ○ | ○ | |
| 10 | 100 | 4.80E+07 | 86 | 50 | −24 | 202 | ○ | ○ | |
| Comparative Example | | | | | | | | | |
| 1 | 650 | 2.70E+11 | 75 | 50 | — | — | X | ○ | |
| 2 | 350 | 5.50E+10 | 82 | 50 | — | — | X | ○ | |
| 3 | 100 | 3.80E+14 | 90 | 50 | — | — | X | ○ | |
| 4 | 100 | 7.20E+13 | 89 | 80 | — | — | X | ○ | |
| 5 | — | — | — | — | 18 | 290 | — | — | |
| 6 | — | — | — | — | −24 | 202 | — | — | |
| 7 | 50 | 4.50E+09 | 90 | — | — | — | X | X | |

All of the term "parts" in the components (A), (B) and (C) express "parts by mass".
A numerical value in each of the parentheses expresses parts by mass or % by mass of each of the components when a total sum of the components (A), (B) and (C) is defined as 100 parts by mass.

TABLE 2

| | (A) | (B) | | | | (C) | | | Thickness of |
|---|---|---|---|---|---|---|---|---|---|
| | PAA (parts) | Glycerin (parts) | N-Methyl-pyrrolidone (parts) | DMSO (parts) | DMF (parts) | Polythiophenes (parts) | Polyanilines 2 (parts) | Polypyrroles (parts) | conductive layer (nm) |
| Example | | | | | | | | | |
| 11 | 45 (30) | 90 (60) | — | — | — | 15 (10) | — | — | 1000 |
| 12 | 45 (25) | 90 (50) | — | — | — | 45 (25) | — | — | 1000 |
| 13 | 45 (30) | — | 90 (60) | — | — | 15 (10) | — | — | 1000 |
| 14 | 45 (30) | — | — | 90 (60) | — | 15 (10) | — | — | 1000 |
| 15 | 45 (30) | — | — | — | 90 (60) | 15 (10) | — | — | 1000 |
| 16 | 45 (30) | 90 (60) | — | — | — | — | 15 (10) | — | 1000 |
| 17 | 45 (30) | 90 (60) | — | — | — | — | — | 15 (10) | 1000 |
| Comparative Example | | | | | | | | | |
| 8 | 45 (75) | — | — | — | — | 15 (25) | — | — | 1000 |
| 9 | 45 (75) | — | — | — | — | 15 (25) | — | — | 500 |
| 10 | 45 (100) | — | — | — | — | — | — | — | 1000 |
| 11 | — | 10 (100) | — | — | — | — | — | — | — |
| 12 | — | — | 10 (100) | — | — | — | — | — | — |
| 13 | — | — | — | 10 (100) | — | — | — | — | 50 |
| 14 | — | — | — | — | 10 (100) | — | — | — | 50 |
| 15 | — | — | — | — | — | 15 (100) | — | — | 300 |

| | Surface resistance (Ω/□) | Total light transmittance (%) | T1 (° C.) | T2 (° C.) | T3 (° C.) | Evaluation of electronic device (solar cell) | Evaluation of electronic device (organic EL element) | Evaluation of sticking (adhesiveness) | Adhesive force (mN/25 mm) | Luminance (cd/cm²) |
|---|---|---|---|---|---|---|---|---|---|---|
| Example | | | | | | | | | | |
| 11 | 5.30E+06 | 86 | 102 | 18 | 290 | ○ | ○ | ○ | 100 | 3600 |
| 12 | 3.20E+06 | 85 | 102 | 18 | 290 | ○ | ○ | ○ | 90 | 3500 |
| 13 | 4.60E+06 | 86 | 102 | −24 | 202 | ○ | ○ | ○ | 70 | 3200 |
| 14 | 1.80E+06 | 86 | 102 | 18.5 | 189 | ○ | ○ | ○ | 67 | 2800 |
| 15 | 2.30E+06 | 86 | 102 | −61 | 153 | ○ | ○ | ○ | 72 | 2400 |
| 16 | 3.20E+06 | 84 | 102 | 18 | 290 | ○ | ○ | ○ | 88 | 2000 |
| 17 | 4.80E+06 | 84 | 102 | 18 | 290 | ○ | ○ | ○ | 85 | 2300 |
| Comparative Example | | | | | | | | | | |
| 8 | 2.70E+11 | 85 | 102 | — | — | X | X | ○ | 67 | 500 |
| 9 | 5.50E+11 | 88 | 102 | — | — | X | X | ○ | 40 | 400 |
| 10 | 2.70E+13 | 90 | 102 | — | — | X | X | ○ | 70 | Not light emitted |
| 11 | — | — | — | 18 | 290 | — | — | — | — | — |
| 12 | — | — | — | −24 | 202 | — | — | — | — | — |
| 13 | — | — | — | 18.5 | 189 | — | — | — | — | — |
| 14 | — | — | — | −61 | 153 | — | — | — | — | — |
| 15 | 6.70E+07 | 90 | — | — | — | X | X | X | — | — |

All of the formulating amounts of the components (A), (B) and (C) express parts by mass of each of the effective ingredient, and a numerical value in each of the parentheses expresses parts by mass or % by mass of each of the components when a total sum of the components (A), (B) and (C) is defined as 100 parts by mass.

From Table 1, the following are confirmed.

In the conductive layers composed of each of the conductive adhesive compositions of Comparative Examples 3 and 4, which are composed of the component (A) alone, and the conductive adhesive compositions of Comparative Examples 1 and 2, which are composed of the components (A) and (C), the surface resistance was high, and the obtained electronic devices did not reveal commutation properties, so that they did not function as a device.

In the conductive adhesive compositions of Comparative Examples 5 and 6, which are composed of the component (B) alone, the film formation properties were poor, so that the film formation of a conductive layer could not be achieved. In addition, the conductive layer composed of the conductive adhesive composition of Comparative Example 7, which is composed of the component (C) alone, did not have adhesiveness, so that an electronic device by means of sticking could not be fabricated.

On the other hand, in the conductive layers of each of the conductive adhesive compositions of Examples 1 to 10, which are composed of the components (A), (B) and (C), the surface resistance value was low, and the transparency was high. In addition, since the adhesiveness was good, the fabrication of an electronic device by means of sticking could be achieved well, and the obtained electronic devices revealed commutation properties, so that it was noted that they are also effective as a device.

From Table 2, the followings are confirmed.

In the conductive layer composed of the conductive adhesive composition of Comparative Example 10, which is composed of the component (A) alone, the surface resistance was high, and the obtained electronic device (solar cell) did not reveal commutation properties, so that it did not function as a device. In addition, though it was attempted to measure the EL characteristic (luminance) of the obtained electronic device (organic EL element), the device did not emit light.

In the conductive layers composed of each of the conductive adhesive compositions of Comparative Examples 8 and 9, which are composed of the components (A) and (C) alone, the surface resistance was high, and the obtained electronic devices (solar cells) did not reveal commutation properties, so that they did not function as a device. In addition, though it was attempted to measure the EL characteristic (luminance) thereof, the luminance was low. In the conductive adhesive compositions of Comparative Examples 11 to 14, which are composed of the component (B) alone, the film formation properties were poor, so that the film formation of a conductive layer could not be achieved. In addition, the conductive layer composed of the conductive adhesive composition of Comparative Example 15, which is composed of the component (C) alone, did not have adhesiveness, so that an electronic device by means of sticking could not be fabricated.

On the other hand, in the conductive layers of each of the conductive adhesive compositions of Examples 11 to 17, which are composed of the components (A), (B) and (C), the surface resistance value was low, and the transparency was high. In addition, since the adhesiveness was good, the fabrication of an electronic device by means of sticking could be achieved well, and the obtained electronic devices revealed commutation properties, so that it was noted that they are also effective as a device. In addition, their EL characteristic (luminance) was high and good.

INDUSTRIAL APPLICABILITY

Since the conductive adhesive composition according to the present invention has excellent adhesiveness and is low in terms of surface resistance and high in terms of transparency, it can be used as a conductive layer of electronic devices such as organic devices, e.g., organic transistors, organic memories, organic EL, etc.; liquid crystal displays; electronic papers; thin-film transistors; electrochromics; electrochemical light-emitting devices; touch panels; displays; solar cells; thermoelectric conversion devices; piezoelectric conversion devices; electric storage devices; etc., and it is useful in the field of an electronic device by a lamination process.

EXPLANATIONS OF LETTERS OR NUMERALS

1: Anodic layer
2: Cathodic layer
3: Photoelectric conversion layer or light-emitting layer
4: Conductive layer

The invention claimed is:

1. An electronic device comprising, arranged in the following order:
a cathodic layer,
a conductive layer,
a photoelectric conversion layer, and
an anodic layer,
wherein the conductive layer comprises a conductive adhesive composition comprising
(A) a water-soluble polyvinyl polymer,
(B) an organic additive, and
(C) a conductive organic polymer compound,
and wherein the water-soluble polyvinyl polymer is polyacrylic acid, the organic additive is at least one member selected from the group consisting of water-soluble polyhydric alcohols and water-soluble pyrrolidones, and the conductive organic polymer compound is at least one member selected from the group consisting of a polyaniline, a polypyrrole, a polythiophene, a polyaniline derivative, a polypyrrole derivative, and a polythiophene derivative.

2. The electronic device according to claim 1,
wherein when a glass transition temperature of the water-soluble polyvinyl polymer is defined as T1, a melting point of the organic additive is defined as T2, and a boiling point of the organic additive at 0.101 MPa (760 mmHg) is defined as T3, a relationship of T2<T1<T3 is satisfied.

3. A method for manufacturing the electronic device according to claim 1, comprising:
forming the conductive layer on a cathodic layer, thereby obtaining a cathodic laminate,
forming a photoelectric conversion layer on an anodic layer, thereby obtaining an anodic laminate, and
sticking a surface of the photoelectric conversion layer in the anodic laminate and a surface of the conductive layer in the cathodic laminate to each other at a temperature at which the conductive adhesive composition is softened or higher.

4. The electronic device according to claim 1, wherein a glass transition temperature of the water-soluble polyvinyl polymer is from −50 to 150° C.

5. The electronic device according to claim 4,
wherein the glass transition temperature of the water-soluble polyvinyl polymer is from 40 to 120° C.

6. The electronic device according to claim 1,
wherein a boiling point of the organic additive is 100° C. or higher at 1.101 MPa (760 mmHg).

7. The electronic device according to claim 1, wherein a weight average molecular weight of the water-soluble polyvinyl polymer is from 500 to 500,000.

8. The electronic device according to claim 1, wherein the conductive organic polymer compound is at least one member selected from the group consisting of a polyaniline, a polypyrrole, and a polythiophene.

* * * * *